United States Patent [19]
Read

[11] 4,314,309
[45] Feb. 2, 1982

[54] ELECTRIC TEST EQUIPMENT MOUNTING

[75] Inventor: Clifford D. Read, Almonte, Canada

[73] Assignee: Northern Telecom Limited, Montreal, Canada

[21] Appl. No.: 104,886

[22] Filed: Dec. 18, 1979

[51] Int. Cl.³ ............................................... H05K 5/06
[52] U.S. Cl. .................................. 361/331; 174/52 R; 200/155 R; 200/301; 200/302; 206/523; 361/399
[58] Field of Search ............. 174/52 R; 361/331, 334, 361/358, 360, 362, 380, 390–395, 399, 428, 364, 371, 365; 200/4, 293, 297, 301, 302, 303, 273, 274, 155 R; 206/523; 211/41

[56] References Cited

U.S. PATENT DOCUMENTS

| | | | |
|---|---|---|---|
| 3,272,908 | 9/1966 | Beecher | 174/52 R |
| 3,436,775 | 4/1969 | Schlosser | 174/52 R |
| 3,808,504 | 4/1974 | Rabie | 361/358 |
| 3,948,436 | 4/1976 | Bambara | 206/523 |
| 4,061,228 | 12/1977 | Johnson | 206/523 |
| 4,173,286 | 11/1979 | Stanko | 206/523 |

*Primary Examiner*—Gerald P. Tolin
*Attorney, Agent, or Firm*—R. J. Austin

[57] ABSTRACT

Assembly of electrical test or electronic equipment for a telecommunications or power cable in a protective mounting which is of compressible material. The equipment is slightly oversize to an entrance to a location space within the mounting so as to compress the mounting material during insertion, continued compression acting to hold the equipment within the space after insertion. Ideally, the equipment has a planar support which engages the inside wall of the mounting to cause compression and a printed circuit board is useful for this purpose. An aperture of the mounting may be aligned with instrumentation of the equipment inside the mounting.

4 Claims, 4 Drawing Figures

ELECTRIC TEST EQUIPMENT MOUNTING

This invention relates to the mounting of electrical or electronic test equipment for a telecommunication or power cable.

Electrical or electronic test equipment is provided for use by telecommunications linesmen and for use for testing power cables. Conventionally such equipment is housed in a metal housing or box within which it is secured in place and simply lidded. These boxed arrangements are completely unsuitable to afford protection against weather conditions in the field particularly as the lids need to be open during use of the equipment. As a result, it is known from experience that very expensive equipment housed in this manner becomes operationally useless within a few weeks.

A further disadvantage which is found is that the boxes do not protect the equipment from damage when they are dropped and replacement of equipment within a box is a tedious operation.

The present invention provides an assembly of electrical or electronic test equipment and a mounting which offers protection to the equipment when located within a housing.

According to the present invention there is provided an assembly of electrical or electronic test equipment and a protective mounting in which the mounting has walls defining a space containing the equipment, the walls are formed of a compressible and shock resistant material and define an opening for insertion of the equipment into the space, the equipment is mounted upon a support which has outside dimensions greater than dimensions across corresponding parts of said space, and the equipment is held within the space by the support engaging and outwardly resiliently urged the material at the inner surface of walls defining the space.

One embodiment of the invention will now be described, by way of example, with reference to the accompanying drawings in which.

Figure 1:
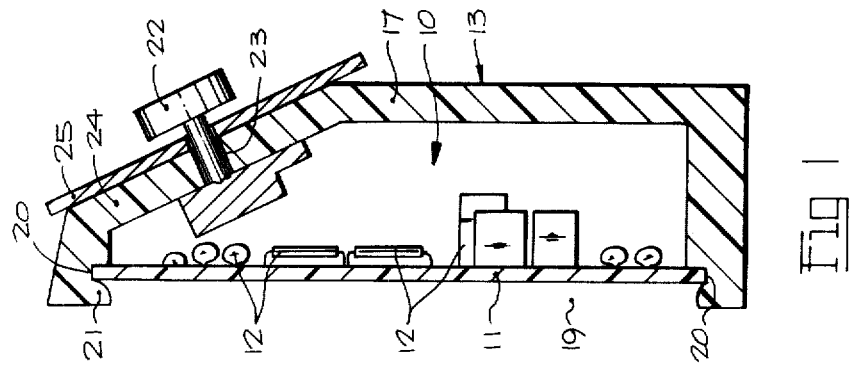
FIG. 1 is a side elevational view, in cross-section, of an assembly of electronic test equipment and mounting.

As shown in FIG. 1, electronic test equipment shown generally at 10, is in the form of a printed circuit board 11 and associated components 12 with the components being carried by the board which is planar.

Figure 2:
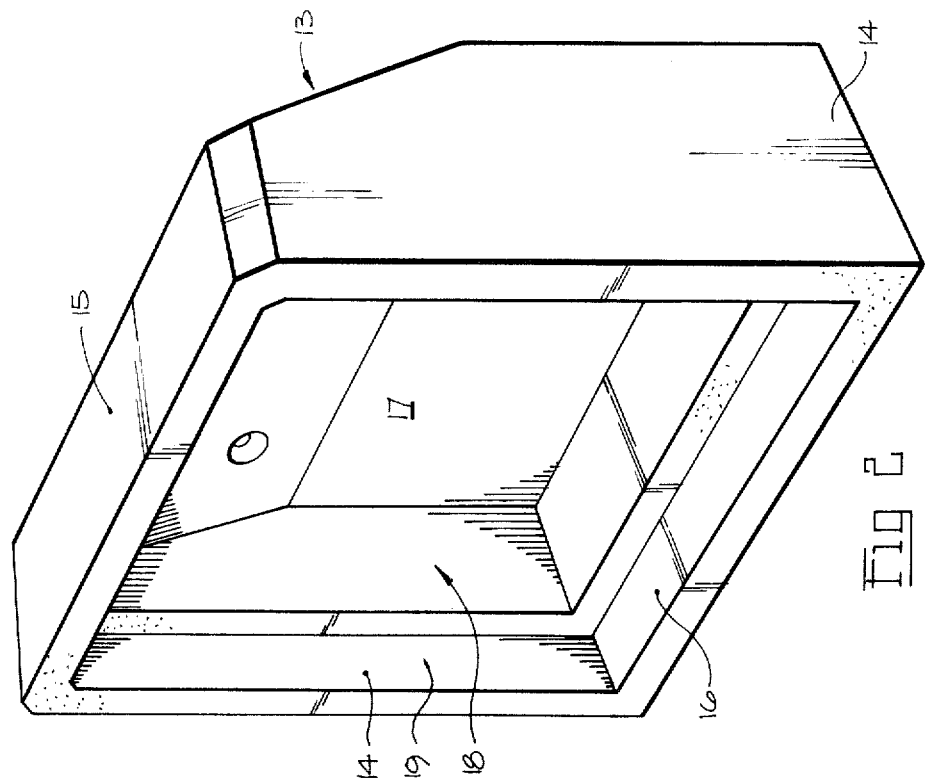
FIG. 2 is an isometric view of the mounting shown in FIG. 1.

The equipment 10 is mounted within a protective mounting 13. The mounting is an integral, one piece surround having an annular wall formation in the form of two side walls 14 (FIG. 2); top wall 15 and bottom wall 16. One end of the annular wall formation is joined to an end wall or front wall 17. A chamber or space 18 is thus defined by the mounting and an opening 19 is defined to the chamber by the annular wall formation and having the same size and shape as a part of the chamber extending immediately from the opening. The mounting is shockproof and moisture resistant and is moulded as a closed cell foam structure with a degree of resiliency.

The circuit board 11 has outside dimensions which are slightly greater than corresponding dimensions of the opening 19 and of the chamber adjacent the opening while being of similar shape. The electronic equipment is mounted within the mounting by manually urging the board into the opening 19 while compressing the foam of annular wall formation outwardly from the chamber. With the electronic equipment located in its desired position, the board 11 lies a short distance from opening 19 (FIG. 1). It is rigidly held in position by a local rectangular compression, as at 20, of the foam of the wall formation which grips the board edge substantially completely around it. The foam between board 11 and the opening 19 has resiliently moved back towards its original position at 21 to prevent any rearward movement of the board.

During mounting of the equipment, any instruments or switches are mounted upon the front wall 17 for accessibility from outside, either for reading purposes or for manual operation. As shown in FIG. 1, a switch 22 extends through a hole 23 in the front wall. Any instruments or switches are sealed against the sides of their holes possibly by the use of a water repellent grease or with rubber 'O' rings.

As shown in FIG. 1, the switch 22 and any other instruments are exposed upon an inclined portion 24 of the front wall. This inclined portion is covered by a metal face plate 25 which is secured to the mounting 13 with a water repellent adhesive. Obviously, holes are provided in the face plate for the instruments and switches.

Figure 3:
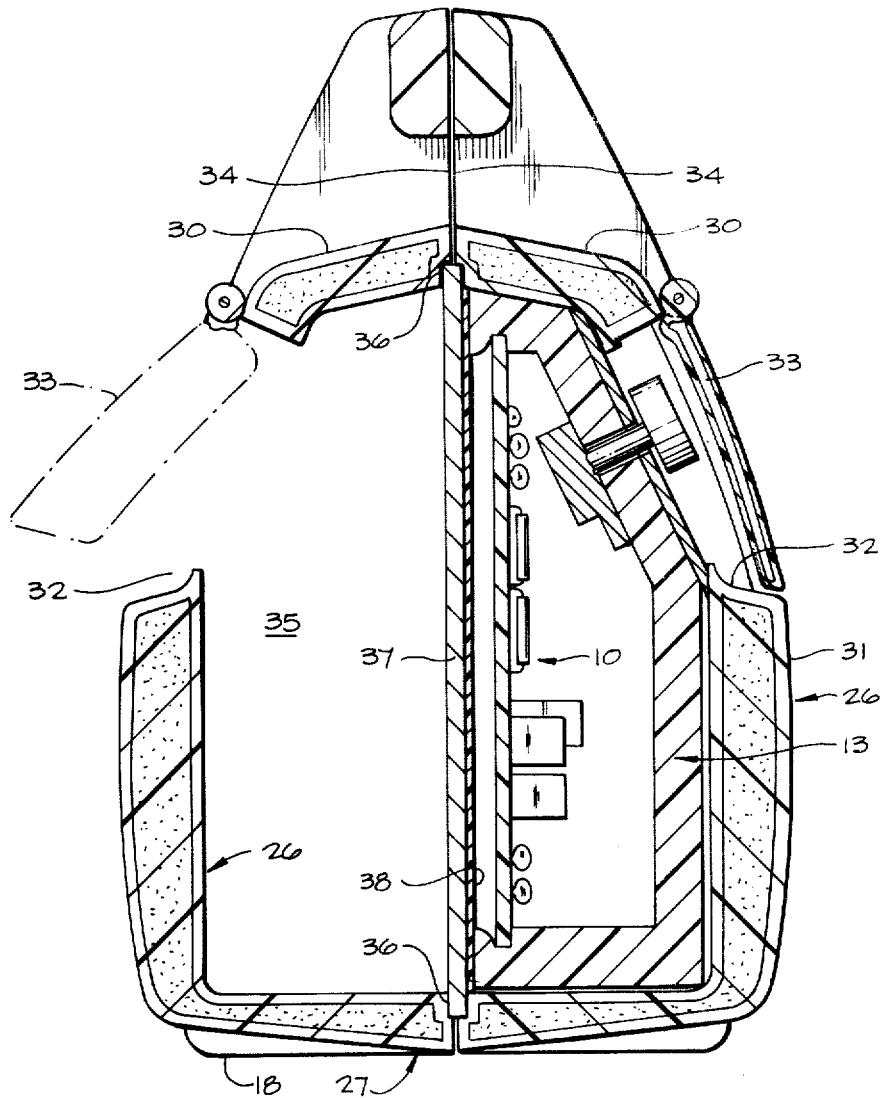
FIG. 3 is a side elevational view, in cross-section of the assembly of FIG. 1 secured within a housing assembly.
Figure 4:
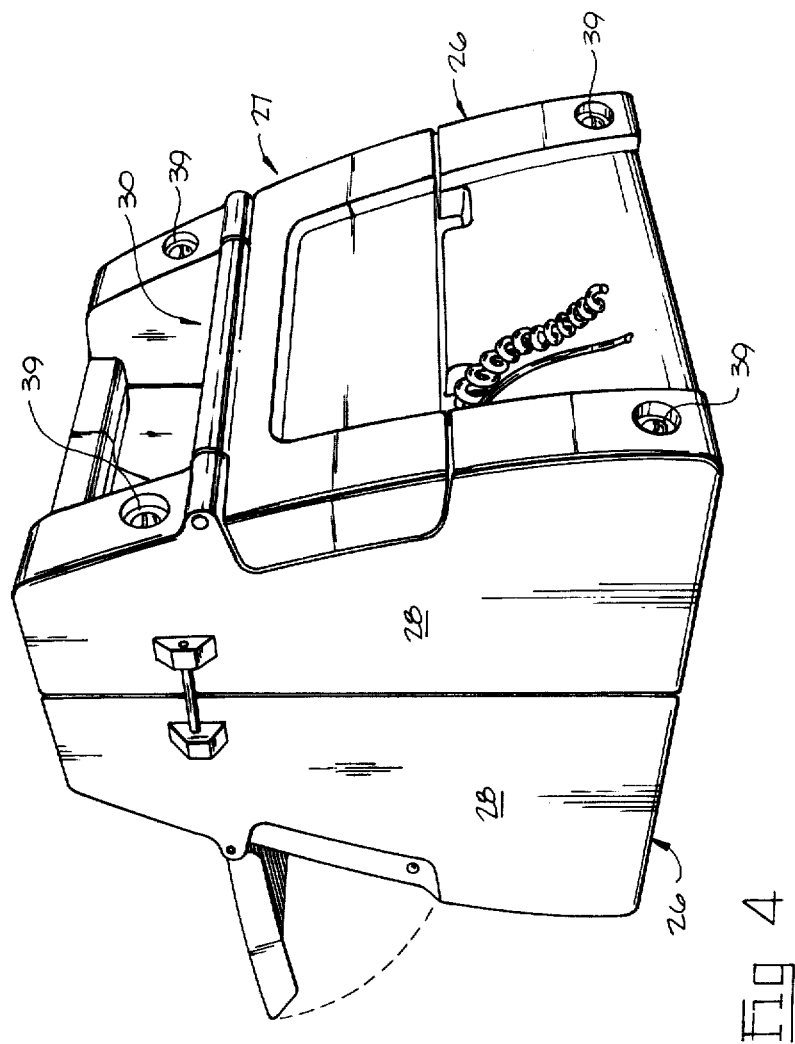
FIG. 4 is an isometric view of the housing assembly.

The assembly of test equipment 10 and the mounting 13 is detachably assembled within a housing 26 of a housing assembly 27 (FIGS. 3 and 4). The housing 26 and the housing assembly are of the construction described in a patent application Ser. No. 104,869 entitled "Electrical Test Equipment Mounting" filed Dec. 18, 1979, and in the name of Clifford Dean Read.

Briefly, the housing assembly comprises two identical housings 26. Each housing has two closed sidewalls 28, base 29 and top 30 and a front wall 31 defining an aperture 32 closable by a flap 33 which is hinged upwardly to open the aperture. Each housing has a rear planar face 34 with a rectangular rear opening to a chamber 35. The rectangular opening is surrounded by a planar narrow recessed surface 36. The surface shape of the chamber 35 defined by sidewalls, top and bottom of a housing 26 is substantially complementary to the outside shape of the annular wall formation of the mounting 13. As shown in FIG. 3, the mounting 13 together with the test equipment is inserted through the rear opening to chamber 35 and the annular wall formation engages the chamber surface with the metal face plate, and instruments and switches aligned with the aperture 32. To hold the assembly 10, 13 securely in place, a metal partition 37 is disposed between confronting recessed surfaces 36 and a foam sheet 38 is compressed by the partition against the mounting 13 to provide a fluid-tight seal.

The housings 26 are held together by bolts (not shown) extending through aligned holes 39 (FIG. 4) as described in the aforementioned application.

As may be seen, the test equipment is held securely within its mounting without the need for fixing bolts or brackets and the mounting acts to provide shock resistance when dropped. Furthermore, although mechanical fixing means are avoided except for the bolts holding housing 26 together, the test equipment is protected against damage caused by dropping and also is substantially sealed from moisture outside the housings. The assembly of test equipment and mounting is quickly and easily removed from the housing for replacement purposes.

What is claimed is:

1. An assembly of electrical or electronic test equipment for a telecommunications or power cable and a protective mounting, in which the mounting is of integral one piece molded construction and has walls defining a space of fixed shape determined by the molded construction, the space containing the equipment, the walls are formed of a closed cell foam and define an opening of fixed shape for insertion of the equipment into the space, the equipment is mounted upon and projects from a planar support which has outside dimensions greater than dimensions between said walls and across said space, the equipment is held within the space by the support engaging and outwardly resiliently urging the foam material at the inner surface of the walls defining the space to close the opening, the support is detachable by movement through the opening transversely to the plane of the support and the equipment is provided with at least one control switch which projects exteriorly from a switch mounting wall which is devoid of said opening, the switch rotatably and sealingly received through a hole formed in the switch mounting wall.

2. An assembly according to claim 1 wherein the support is a planar support and engages the walls substantially completely around the support.

3. An assembly according to claim 3 enclosed within a housing with the mounting inserted into a chamber of the housing with the end wall of the mounting aligned with a closable aperture in the housing and with the mounting held immovably within the housing by a retaining means which seals the opening to the space.

4. An assembly of electrical or electronic test equipment for a telecommunications or power cable, a protective mounting and a housing, in which the mounting is of integral one piece molded construction and has walls defining a space of fixed shape determined by the molded construction, the space containing the equipment, the walls are formed of a closed cell foam and define an opening of fixed shape for insertion of the equipment into the space, the equipment is mounted upon and projects from a planar support which has outside dimensions greater than dimensions between said walls and across said space, the equipment is held within the space by the support engaging and outwardly resiliently urging the foam material at the inner surface of the walls defining the space to close the opening, the support is detachable by movement through the opening transversely to the plane of the support, the equipment is provided with a least one control switch which projects exteriorly from a switch mounting wall which is devoid of said opening, the switch rotatably and sealingly received through a hole formed in the switch mounting wall, and the mounting is enclosed within the housing formed with a closable aperture, the opening of the mounting aligned with the housing aperture, the aperture having a retaining means which extends across the aperture, holds the mounting immovably within the housing and seals the opening to the space.

* * * * *